United States Patent [19]
Lee et al.

[11] Patent Number: 6,087,859
[45] Date of Patent: Jul. 11, 2000

[54] CURRENT MIRROR TYPE SENSE AMPLIFIER CIRCUIT FOR SEMICONDUCTOR MEMORY DEVICE

[75] Inventors: Dong-Woo Lee, Seoul; Heung-Soo Im, Kyunggi-do, both of Rep. of Korea

[73] Assignee: Samsung Electronics Co., Ltd., Rep. of Korea

[21] Appl. No.: 09/216,197

[22] Filed: Dec. 18, 1998

[30] Foreign Application Priority Data

Dec. 30, 1997 [KR] Rep. of Korea .................. 97-79450

[51] Int. Cl.[7] ......................................................... G11C 7/06
[52] U.S. Cl. ................................ 327/51; 327/52; 327/53
[58] Field of Search ........................................ 327/51–56

[56] References Cited

U.S. PATENT DOCUMENTS

| | | | |
|---|---|---|---|
| 5,504,442 | 4/1996 | Tanoi | 327/51 |
| 5,856,748 | 1/1999 | Seo et al. | 327/53 |
| 6,002,275 | 12/1999 | Hosokawa et al. | 327/51 |

*Primary Examiner*—Tuan T. Lam
*Attorney, Agent, or Firm*—Myers Bigel Sibley & Sajovec

[57] ABSTRACT

A sense amplifier circuit includes a first voltage-controlled current source to supply current proportional to a first bias voltage to a reference node and a second voltage-controlled current source to supply current proportional to a second bias voltage to a sensing node. The first and second bias voltages are internally generated in response to an externally applied sense amp control signal. A current mirror circuit is also provided for the sense amplifier circuit. The current mirror circuit commonly deliver current proportional to the voltage level of the reference node to the reference and sensing nodes. A differential amplifier amplifies a difference voltage between reference and sensing nodes. This current mirror type sense amplifier circuit allows data sensing operation to be performed without being influenced from the external conditions and without sensing speed loss due to the instability of the precharge current since the voltage-controlled current sources are controlled by the internal bias voltages.

12 Claims, 4 Drawing Sheets

CURRENT MIRROR TYPE SENSE AMPLIFIER CIRCUIT FOR SEMICONDUCTOR MEMORY DEVICE

FIELD OF THE INVENTION

The present invention relates to semiconductor memory devices and, more particularly to sense amplifier circuit of semiconductor memory devices.

BACKGROUND OF THE INVENTION

Referring to FIG. 1, a conventional current mirror type sense amplifier circuit of semiconductor memory devices is illustrated. The sense amplifier is comprised of a reference voltage generating circuit 100 for generating a reference voltage, a sensing voltage generating circuit 200 for generating a sensing voltage, and a differential amplifier 300 for amplifying a difference voltage between the reference voltage and the sensing voltage.

A variable current sinker 270 has a current driving capability corresponding to the data state of a memory cell (not shown). That is, the variable current sinker 270 has current driving capability larger than that of a constant current sinker 170 when a memory cell stores a logic "0" (or logic "1") data, but it has current driving capability smaller than that of the constant current sinker 170 when the memory cell stores a logic "1" (or logic "0") data.

A sense amp enable signal $\overline{SA}$ is externally applied to an input of a complementary metal oxide semiconductor (CMOS) inverter formed by a P-channel MOS (PMOS) transistor 101 and an N-channel MOS (NMOS) transistor 102 within the reference voltage generating circuit 100. This signal $\overline{SA}$ is also applied to an input of an inverter formed by a PMOS transistor 201 and an NMOS transistor 202 in the sensing voltage generating circuit 200. NMOS precharge transistors 103 and 203 are provided for the voltage generating circuits 100 and 200. These precharge transistors 103 and 203 has their gates externally applied with a precharge control signal φPRE. Current mirror type PMOS transistors 104 and 204 are provided for the reference voltage generating circuit 100 and the sensing voltage generating circuit 200, respectively. Between node N2 and the dummy data line DDL, placed is an NMOS transistor 105 whose gate is coupled to an output (i.e., node N1) of the inverter formed by transistors 101 and 102. Also, an NMOS transistor 205 is placed between the node N5 and the main data line DL. Gate of the transistor 205 is coupled to an output (i.e., node N4) of the inverter formed by the transistors 201 and 202. NMOS transistors 106 and 206 are further provided for the voltage generating circuit 100 and 200, respectively.

The sense amplifier is enabled when the sense amp enable signal $\overline{SA}$ changes from a logic high level to a logic low level. With the application of the low level signal $\overline{SA}$, PMOS transistors 101 and 201 are turned on, thus the voltage levels of the nodes N1 and N4 go high so as to make NMOS transistors 105 and 205 conductive. Thereafter, when the signal φPRE goes high, the transistors 103 and 203 are turned on so that the voltage levels of nodes N2, N3, N5 and N6 (i.e., data lines DDL and DL) start to increase. The increase of the voltage levels of the nodes N3 and N6 are stopped at a point that respective current driving capacities of the PMOS transistors 101 and 201 balance with those of the NMOS transistors 106 and 206.

After a given precharge period, the precharge control signal φPRE becomes inactive low again and so the transistors 103 and 203 are rendered off At this time, the transistors 104 and 204 deliver the same amount of current as sinks to the ground voltage Vss via the current sinker 170 so as to maintain the voltage level of node N2 constant. This constant voltage is applied to the input IN1 of the differential amplifier 300 as a reference voltage. Owing to the current mirror arrangement, the transistors 204 conducts the same current as the transistor 104 does. So, if the variable current sinker 270 has a current driving capability larger than that of the constant current sinker 170, the sensing voltage level on node N5 becomes lower than the reference voltage level on the node N1. On the contrary, if the variable current sinker 270 has a current driving capability smaller than that of the constant current sinker 170, the sensing voltage of node N5 becomes higher than the reference voltage on the node N2. These voltage differences are amplified by the differential amplifier 300.

In general, the amount of current flowing through a MOS transistor is proportional to the gate-source voltage. NMOS transistors 103 and 203 have their sources coupled to the nodes N2 and N5 of different voltages, respectively, even though their drains and gates are applied with a constant voltage (i.e., power supply voltage) during a precharge period. Thus, the transistor 203 does not have the same current driving ability as the transistor 103 during the precharge period. Due to these differences in current, the voltage difference between the nodes N2 and N5 is not caused only by the difference between the current driving abilities of the current sinkers 170 and 270. That is, when the variable current sinker 270 has current driving capability larger than that of the constant current sinker 170 during the precharge period, the node N5 is expected to be pulled down faster than the node N2, but not because the node N5 is lower than the node N2 and so the transistor 203 conducts current larger than that of the transistor 103; In addition, when the variable current sinker 270 has current driving capability smaller than that of the constant current sinker 170 during the precharge period, the node N5 is expected to be pulled up faster than the node N2, but not because the node N5 is higher than the node N2 and so the transistor 203 conducts current smaller than that of the transistor 103.

As described above, in case the transistors 103 and 203 cannot deliver the same current to the nodes N2 and N5 during a precharge period, (1) there may be a very small difference in the voltage levels of the nodes N2 and N5, thereby reducing the data sensing speed and the sensing margin, (2) in the worst cases, the voltage levels of the nodes N2 and N5 may be reversed so that reading errors will occur.

To overcome such shortcomings, the use of the NMOS precharge transistors 103 and 203 should be restricted only to the early stage of precharging the data lines DDL and DL rapidly, and only the PMOS precharge transistors 104 and 204 having the same current driving capability must be devoted to the remaining stage of the precharge period that requires the precise precharge control.

In the above-described conventional sense amplifier circuit, the NMOS precharge transistors 103 and 203 are shut off compulsorily and abruptly by the external precharge control signal φPRE. It is however not easy to control the inactivation timing of the precharge control signal φPRE, and it is also desirable that the precharge transistors 103 and 203 are gradually shut off since such an abrupt shut-off will cause an unexpected transient in data sensing.

Moreover, as the precharge voltage levels on the nodes N2 and N5 increase during a precharge period, the source voltage levels of NMOS transistors 103 and 203 also increase and so their gate-source voltage decrease. Thus, NMOS transistors 103 and 203, as well as PMOS transistors 104 and 204, have their higher threshold voltages than expected due to the body effect (these threshold voltage variations due to the body effect can also be affected by the various process variations). As a result of this, the transistors 103 and 203 will shut off naturally before the discharge control signal φPRE becomes inactive. Such a natural shut-off also appears in the PMOS transistors 104 and 204 having the same current driving ability owing to their current mirror arrangement so that the transistors 104 and 204 will shut off in worst case before the shut-off of NMOS transistors 103 and 203 that usually have different current driving abilities, thereby causing poor sensing performance and reading errors.

SUMMARY OF THE INVENTION

An object of the present invention, therefore, is to overcome the problems existing in the prior art sense amplifier circuit, and to provide a sense amplifier circuit capable of providing a stable sensing performance, thus preventing reading errors.

It is another object of the present invention to provide a sense amplifier circuit capable of performing a data sensing operation uniformly without being influenced from the external conditions.

It is still another object of the invention to provide a sense amplifier circuit having a fast sensing speed and providing an enough sensing margin.

These and other objects, advantages and features of the present invention are provided by sense amplifier circuits for semiconductor memories, such as read-only memories (ROMs), which include a first voltage-controlled current source to supply current proportional to a first bias voltage to a reference node and a second voltage-controlled current source to supply current proportional to a second bias voltage to a sensing node. The first and second bias voltages are internally generated in response to an externally applied sense amp control signal (e.g., $\overline{SA}$). A current mirror circuit is also provided for the sense amplifier circuits of the invention. The current mirror circuit commonly deliver current proportional to the voltage level of the reference node to the reference and sensing nodes. The sense amplifier circuit further includes a differential amplifier which has a first input coupled to the reference node, a second input coupled to the sensing node and an output for providing an amplified voltage difference between the reference and sensing nodes. In addition, first and second current sinkers are provided for the sense amplifier circuit. The first current sinker is coupled to the reference node to sink a constant amount of current to a reference voltage supply (e.g., ground voltage supply). The second current sinker is coupled to the sensing node to sinking a variable amount of current to the reference voltage supply.

According to a preferred aspect of the present invention, the first bias circuit includes an inverter having an input for receiving the external sense amp control signal and an output coupled to the reference node, and a MOS transistor having its source-drain path coupled between the reference node and the reference voltage supply and its gate coupled to the first data line. The second bias circuit also includes an inverter having an input for receiving the external sense amp control signal and an output coupled to the sensing node, and a MOS transistor having its source-drain path coupled between the sensing node and the reference voltage supply and its gate coupled to the second data line. In particular, the first voltage-controlled current source is formed of an NMOS transistor which has its source-drain path coupled between a power voltage supply and the reference node and a gate coupled to the first bias voltage. The second voltage-controlled current source is also formed of an NMOS transistor which has its source-drain path coupled between the power voltage supply and the sensing node and its gate coupled to the second bias voltage.

As is apparent from the foregoing, according to the sense amplifier circuits of the invention, a uniform data sensing operation can be performed without being influenced from the external conditions and without sensing speed loss due to the instability of the precharge current since the gates of the MOS transistors acting as the voltage-controlled current sources are controlled by the internal bias voltages.

BRIEF DESCRIPTION OF THE DRAWINGS

The novel features believed characteristic of the invention are set forth in the appended claims. The invention itself, however, as well as preferred modes of use, further objects, and advantages thereof, will best be understood by reference to the following detailed description of illustrative embodiments when read in conjunction with the accompanying drawings, wherein:

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
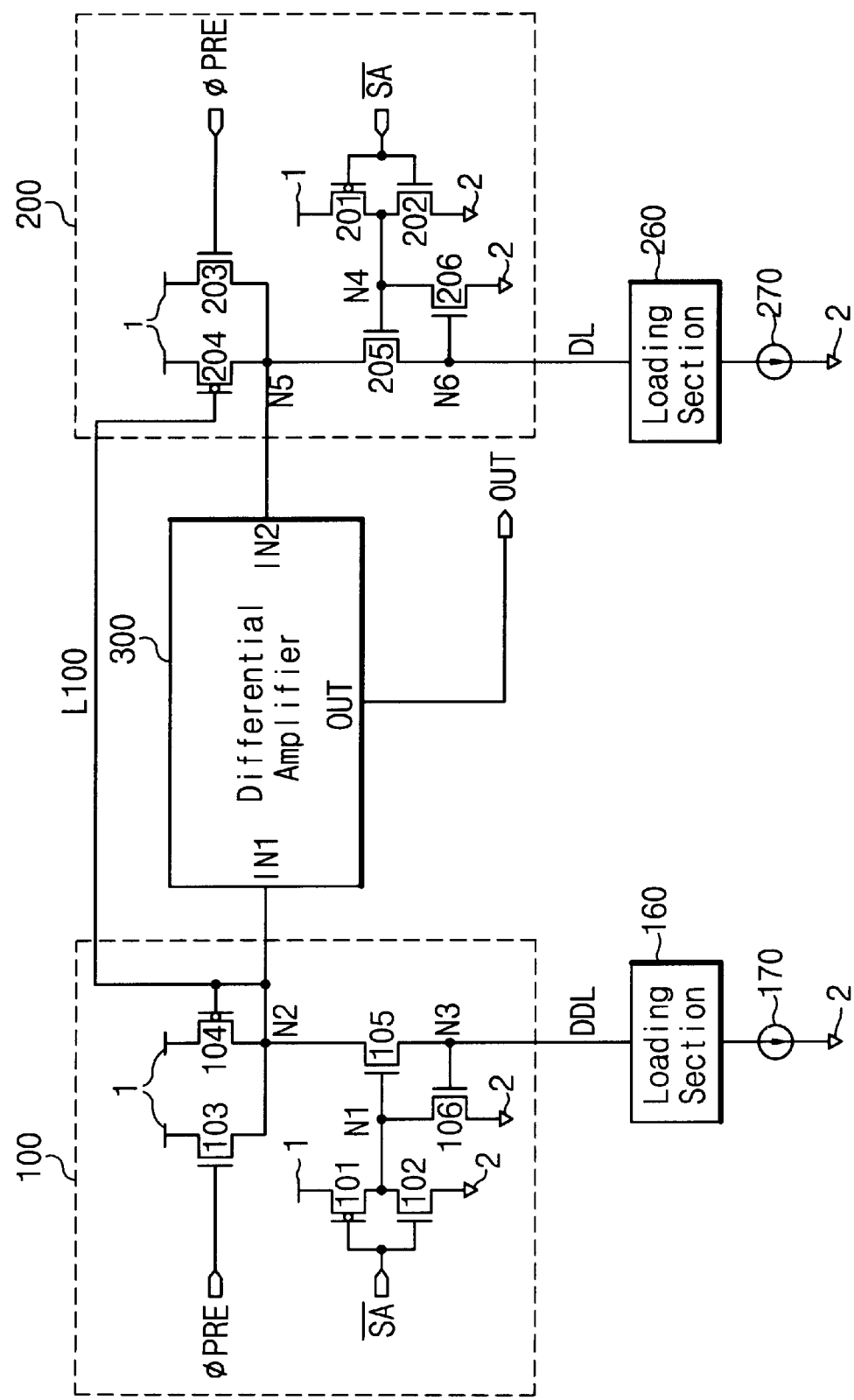
FIG. 1 is a circuit diagram illustrating a conventional current mirror type sense amplifier circuit.
Figure 2:
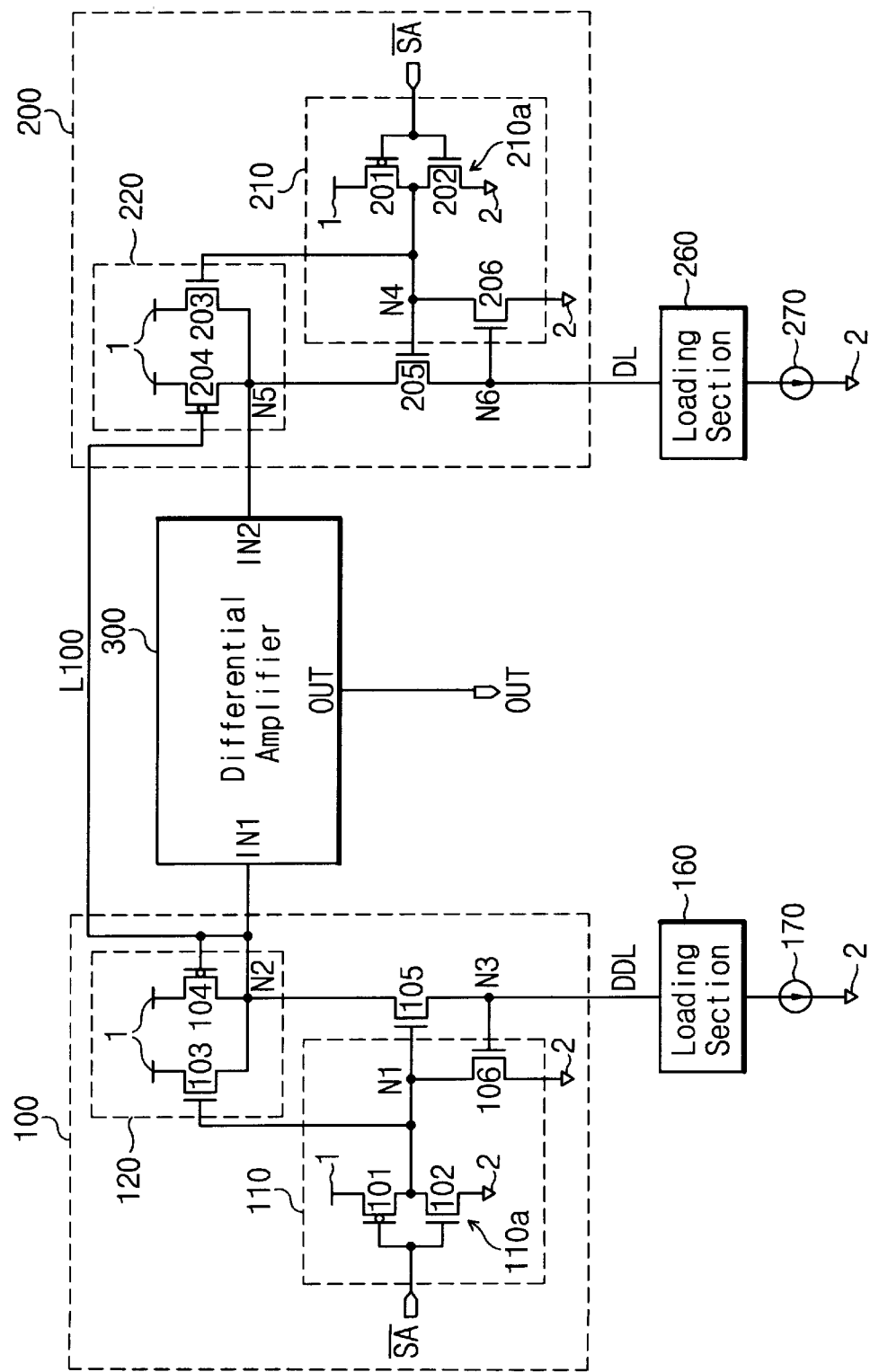
FIG. 2 is a circuit diagram illustrating an embodiment of a current mirror type sense amplifier circuit according to the present invention.

Referring first to FIG. 2, an embodiment of a sense amplifier circuit according to the present invention is illustrated. The sense amplifier circuit includes a reference voltage generating circuit 100, a sensing voltage generating circuit 200, and a differential amplifier 300. The reference voltage generating circuit 100 is coupled to a dummy data line DDL on which a loading section 160 and a constant current sinker 170 are disposed. Similarly, the sensing voltage generating circuit 200 is coupled to a main data line DL on which a loading section 260 and a variable current sinker 270 are also disposed in order. The variable current sinker 270 has a current driving capability corresponding to the data state of a memory cell. That is, the variable current sinker 270 has a current driving capability larger than that of the constant current sinker 170 when the memory cell stores a logic "0" (or logic "1") data, but it has a current driving capability smaller than that of the constant current sinker 170 when the memory cell stores a logic "1" (or logic "0") data.

The reference voltage generating circuit 100 is comprised of a bias circuit 110, a current source circuit 120, and an NMOS transistor 105 serving as a switch element. NMOS transistor 105 has its gate coupled to a reference bias node N1 and its source-drain path coupled between a reference voltage output node N2 and a reference line junction node N3. The bias circuit 110 includes a CMOS inverter 110a formed by a PMOS transistor 101 and an NMOS transistor 102, and an NMOS transistor 106. The transistors 101 and 102 are coupled in series between a voltage supply (i.e., power voltage supply) 1 and a reference voltage supply (i.e., ground voltage supply) 2. NMOS transistor 106 has its source-drain path coupled between the node N1 and the ground voltage supply 2 and its gate coupled to the node N3 (i.e., dummy data line DDL). The inverter 110a has its input (i.e., gates of the transistors 101 and 102) externally applied with a sense amp enable signal $\overline{SA}$ and its output coupled to the node N1. The current source circuit 120 has an NMOS transistor 103 and a PMOS transistor 104. NMOS transistor 103 has its current path coupled between the power voltage supply 1 and the node N2 and its gate coupled to the node N1. The source-drain path of PMOS transistor 104 is coupled between the power voltage supply 1 and the node N2 and its gate coupled to the node N2 too.

Similarly, the reference voltage generating circuit 200 also includes a bias circuit 210, a current source circuit 220, and an NMOS transistor 205 serving as a switch element. NMOS transistor 205 has its gate coupled to a sensing bias node N4 and its source-drain path coupled between a sensing voltage output node N5 and a data line junction node N6. The bias circuit 210 includes a CMOS inverter 210a formed by a PMOS transistor 201 and an NMOS transistor 202, and an NMOS transistor 206. The transistors 201 and 202 are coupled in series between the power voltage supply 1 and ground voltage supply 2. NMOS transistor 206 has its source-drain path coupled between the node N4 and the ground voltage supply 2 and its gate coupled to the node N6 (i.e., main data line DL). The inverter 210a has its input (i.e., gates of the transistors 201 and 202) applied with the external sense amp enable signal $\overline{SA}$ and its output coupled to the node N4. The current source circuit 220 has an NMOS transistor 203, and a PMOS transistor 204. The transistor 203 has its current path coupled between the power voltage supply 1 and the node N5 and its gate coupled to the node N4. The source-drain path of PMOS transistor 204 is coupled between the power voltage supply 1 and the node N5 and its gate coupled via a line L100 to the node N2 so as to construct a current mirror circuit together with PMOS transistor 104 within the reference voltage generating circuit 100.

One input IN1 of the differential amplifier 300 is coupled with the reference voltage output node N2 and the other thereof is coupled to the sensing voltage output node N5. The differential amplifier 300 amplifies a voltage difference between the nodes N2 and N5 and provides the amplified voltage difference via its output OUT.

Figure 3:
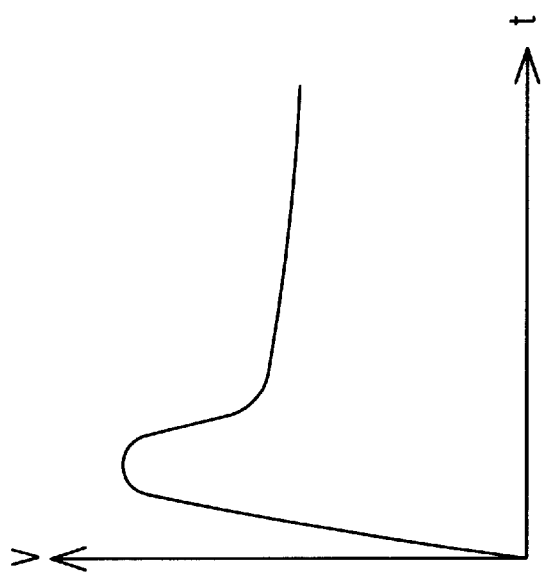
FIG. 3 is a graph illustrating the voltage variation on each of the precharge bias nodes of the sense amplifier circuit of FIG. 2, with respect to a precharge time.

The sense amplifier circuit is enabled when the sense amp enable signal $\overline{SA}$ changes from a logic high level to a logic low level. With the application of the low level signal $\overline{SA}$, PMOS transistors 101 and 201 are turned on, thus the voltage levels of nodes N1 and N4 increase and go up to a high level (i.e., power supply voltage level). So, NMOS transistors 103 and 203 become conductive and begin to deliver current to nodes N2 and N5. Simultaneously, PMOS transistors 104 and 204 are conductive to deliver current to the nodes N2 and N5. Thus, nodes N2 and N5 are precharged rapidly enough to render NMOS transistors 105 and 205 conductive. This leads the voltage levels of nodes N3 and N6 to increase sufficiently so that NMOS transistors 106 and 206 become conductive. So, the voltage levels of node N1 and N4 are gradually reduced to the levels that respective current driving capacities of PMOS transistors 101 and 201 balance with those of NMOS transistors 106 and 206 and then fixed on the balance levels, as shown in FIG. 3. This also means that the increase of the voltage levels on the nodes N3 and N6 stop at points that the current driving abilities of NMOS transistors 105 and 205 balance with those of current sinkers 170 and 270, respectively.

As the voltage levels on nodes N1 and N4 are decreased by the transistors 106 and 206 and those on nodes N2 and N5 are increased by the transistors 103, 104, 203 and 204, the conductivity of NMOS precharge transistors 103 and 203 decrease little by little and at last the transistors 103 and 203 are shut off. At this time, however, PMOS transistors 104 and 204 having the same current driving capability still remain conductive. So, the nodes N2 and N5 are precharged only by the PMOS transistors 104 and 204.

As described above, since NMOS precharge transistors 103 and 203 are gradually shut off by internal bias voltages, as shown in FIG. 3, it is possible to prevent data sensing errors due to abrupt changes of voltage levels on nodes N2 and N5. In addition, a data sensing operation can be performed uniformly without being influenced from the external conditions such as process variations because the NMOS precharge transistors 103 and 203 are shut off by decreasing their gate voltages internally.

Figure 4:
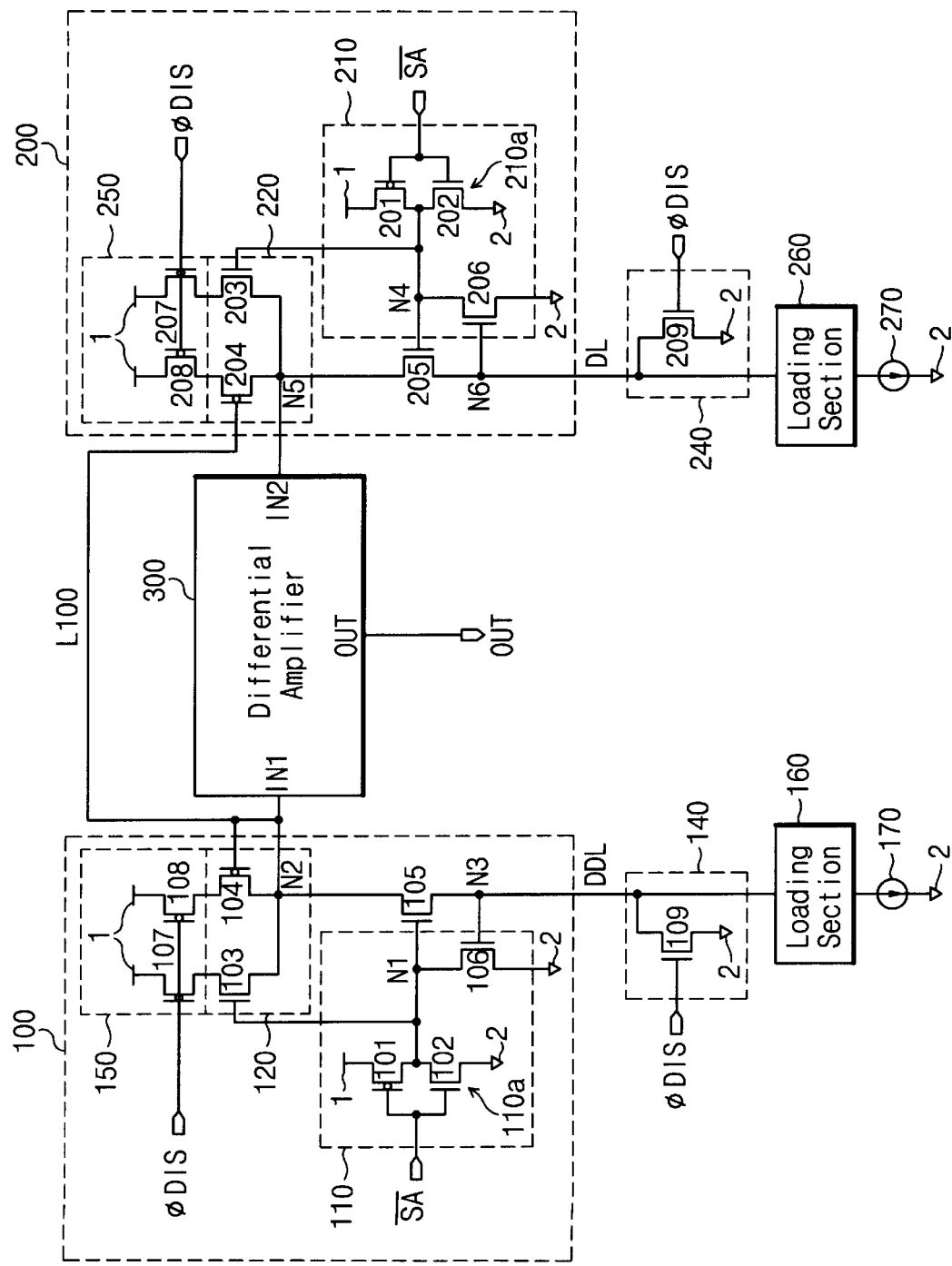
FIG. 4 is a circuit diagram illustrating another embodiment of a current mirror type sense amplifier circuit according to the present invention.

FIG. 4 illustrates another embodiment of a current mirror type sense amplifier circuit according to the present invention. Referring to FIG. 4, the sense amplifier circuit of this embodiment has the same arrangement as that shown in FIG. 2 except that data line discharge circuits 140 and 240 are provided to discharge the data lines DDL and DL respectively in response to an external discharge control signal φDIS and switch circuits 150 and 250 are added between the power voltage supply 1 and the current source circuits 120 and 220, respectively. In FIG. 4, the same parts as those shown in FIG. 2 are represented with like reference numerals and to avoid description duplication, accordingly, their explanation will be omitted herein.

The discharge circuit 140 is formed by an NMOS transistor 109. The source-drain path of the transistor 109 is coupled between the dummy data line DDL and the ground voltage supply 2 and the gate thereof is fed with the discharge control signal φDIS. The discharge circuit 240 is also formed by an NMOS transistor 209 having its source-drain path coupled between the main data line DL and the ground voltage supply 2 and its gate provided with the discharge control signal φDIS. The switch circuit 150 includes two PMOS transistors 107 and 108. The transistor 107 has its source-drain path coupled between the power voltage supply 1 and the source-drain path of the transistor 103 and its gate applied with the discharge control signal φDIS. The transistor 108 has its source-drain path coupled between the power voltage supply 1 and the source-drain path of the transistor 104 and its gate coupled to the discharge control signal φDIS. The switch circuit 250 also includes two PMOS transistors 207 and 208. The transistor 207 has its source-drain path coupled between the power voltage supply 1 and the source-drain path of the transistor 203 and its gate coupled to the discharge control signal φDIS. The source-drain path of the transistor 208 is coupled between the power voltage supply 1 and the source-drain path of the transistor 204, and the gate thereof is applied with the discharge control signal φDIS.

The discharge control signal φDIS becomes active before the precharge period. NMOS discharge transistors 109 and 209 are turned on in response to the discharge control signal φDIS so that the data lines MDL and DDL are discharged to the ground level. This discharging enables the data lines MDL and DDL to have the same precharge response. At the same time, PMOS switching transistors 107, 108, 207 and 208 are turned off in order to prevent the occurrence of short circuits between the power voltage supply 1 and the ground voltage supply 2. The transistors 107, 108, 207 and 208 also act as electrostatic discharge (ESD) protection devices to protect the sense amplifier circuit from static electricity.

As described above, according to the sense amplifier circuits of the invention, a uniform data sensing operation can be performed without being influenced from the external conditions and without sensing speed loss due to the instability of the precharge current since the gates of the MOS transistors acting as the voltage-controlled current sources are controlled by the internal bias voltages.

The foregoing description of the first and second embodiments of the present invention has been presented, using specific terms, for purposes of illustration and description. Numerous modifications and variations of the present invention are possible in light of the above teachings. It is therefore to be understood that, within the scope of the appended claims, the present invention can be practiced in a manner other than as specifically described herein.

What is claimed is:

1. A sense amplifier circuit for semiconductor memory devices, comprising:
   a first bias circuit (110) for supplying a first bias voltage in response to an externally applied sense amp enable signal;
   a first voltage-controlled current source (103) for supplying current proportional to the first bias voltage to a first node;
   a second bias circuit (210) for supplying a second bias voltage in response to the external sense amp enable signal;
   a second voltage-controlled current source (203) for supplying current proportional to the second bias voltage to a second node;
   a current mirror circuit (104, 204) for supplying current proportional to a voltage on the first node to the first and second nodes; and
   a differential amplifier having a first input coupled to the first node, a second input coupled to the second node and an output for providing an amplified voltage difference between the first and second nodes.

2. The sense amplifier circuit according to claim 1, further comprising:
   a first current sinker (170) coupled to the first node, for sinking a constant amount of current to a reference voltage supply; and
   a second current sinker (270) coupled to the second node, for sinking a variable amount of current to the reference voltage supply.

3. The sense amplifier circuit according to claim 1, wherein the semiconductor memory devices are read-only memories (ROMs).

4. A sense amplifier circuit for semiconductor memory devices, comprising:
   a first and second voltage supplies (1, 2) for supplying a first and second supply voltages, the first supply voltage being higher than the second supply voltage;
   a first and second data lines (DDL, DL);
   a first current sinker (170) coupled to the first data line, for sinking a constant amount of current to the second voltage supply;
   a second current sinker (270) coupled to the second data line, for sinking a variable amount of current to the second voltage supply;
   a first and second nodes (N1, N4);
   a first bias circuit (110) for supplying a first bias voltage to the first node in response to an externally applied sense amp enable signal;
   a second bias circuit (210) for supplying a second bias voltage to the second node in response to the external sense amp enable signal;
   a third and fourth nodes (N2, N5);
   a first MOS transistor (105) having a source-drain path coupled between the first data line and the third node, and a gate coupled to the first node;
   a second MOS transistor (205) having a source-drain path coupled between the second data line and the fourth node, and a gate coupled to the second node;
   a third MOS transistor (103) having a source-drain path coupled between the first voltage supply and the third node, and a gate coupled to the first node;
   a fourth MOS transistor (203) having a source-drain path coupled between the first voltage supply and the fourth node, and a gate coupled to the second node; and
   a differential amplifier (300) having a first input (IN1) coupled to the third node, a second input (IN2) coupled to the fourth node and an output (OUT), the differential amplifier amplifying a difference between voltages on the third and fourth nodes and providing the amplified difference through the output.

5. The sense amplifier circuit according to claim 4, wherein the first bias circuit comprises an inverter (110a) having an input for receiving the external sense amp control signal and an output coupled to the first node, and a MOS transistor (106) having a source-drain path coupled between the first node and the second voltage supply and a gate coupled to the first data line; and the second bias circuit comprises an inverter (210a) having an input for receiving the external sense amp control signal and an output coupled to the second node, and a MOS transistor (206) having a source-drain path coupled between the second node and the second voltage supply and a gate coupled to the second data line.

6. The sense amplifier circuit according to claim 4, further comprising:
   a fifth MOS transistor (104) having a source-drain path coupled between the first voltage supply and the third node and a gate coupled to the third node, and
   a sixth MOS transistor (204) having a source-drain path coupled between the first voltage supply and the fourth node and a gate coupled to the third node.

7. The sense amplifier circuit according to claim 4, wherein the semiconductor memory devices are read-only memories (ROMs).

8. A sense amplifier circuit for semiconductor memory devices, comprising:
   a first and second voltage supplies (1, 2) for supplying a first and second supply voltages, the first supply voltage being higher than the second supply voltage;
   a first and second data lines (DDL, DL);
   a first and second MOS transistors (107, 207) each having a source-drain path whose one end is coupled to the first voltage supply and a gate coupled to an externally applied discharge control signal;

a first current sinker (170) coupled to the first data line, for sinking a constant amount of current to the second voltage supply;

a second current sinker (270) coupled to the second data line, for sinking a variable amount of current to the second voltage supply;

a first and second nodes (N1, N4);

a first bias circuit (110) for supplying a first bias voltage to the first node in response to an externally applied sense amp enable signal;

a second bias circuit (210) for supplying a second bias voltage to the second node in response to the external sense amp enable signal;

a third and fourth nodes (N2, N5);

a third MOS transistor (105) having a source-drain path coupled between the first data line and the third node, and a gate coupled to the first node;

a fourth MOS transistor (205) having a source-drain path coupled between the second data line and the fourth node, and a gate coupled to the second node;

a fifth MOS transistor (103) having a source-drain path coupled between the third node and the other end of the source-drain path of the first MOS transistor, and a gate coupled to the first node;

a sixth MOS transistor (203) having a source-drain path coupled between the fourth node and the other end of the source-drain path of the second MOS transistor, and a gate coupled to the second node; and a differential amplifier (300) having a first input coupled to the third node, a second input coupled to the fourth node and an output, the differential amplifier amplifying a difference between voltages on the third and fourth nodes and providing the amplified difference through the output.

9. The sense amplifier circuit according to claim 8, wherein the first bias circuit comprises an inverter (110a) having an input for receiving the external sense amp enable signal and an output coupled to the first node, and a MOS transistor (106) having a source-drain path coupled between the first node and the second voltage supply and a gate coupled to the first data line; and the second bias circuit comprises an inverter (210a) having an input for receiving the external sense amp enable signal and an output coupled to the second node, and a MOS transistor (206) having a source-drain path coupled between the second node and the second voltage supply and a gate coupled to the second data line.

10. The sense amplifier circuit according to claim 8, further comprising:

a seventh and eighth MOS transistors (108, 208) each having a source-drain path whose one end is coupled to the first voltage supply and a gate coupled to the external discharge control signal;

a ninth MOS transistor (104) having a source-drain path coupled between the third node and the other end of the source-drain path of the seventh MOS transistor and a gate coupled to the third node; and a tenth MOS transistor (204) having a source-drain path coupled between the fourth node and the other end of the source-drain path of the eighth MOS transistor.

11. The sense amplifier circuit according to claim 8, further comprising:

a seventh MOS transistor (109) having a source-drain path coupled between the first data line and the second voltage supply and a gate coupled to the external discharge control signal; and an eighth MOS transistor (209) having a source-drain path coupled between the second data line and the second voltage supply and a gate coupled to the external discharge control signal.

12. The sense amplifier circuit according to claim 8, wherein the semiconductor memory devices are read-only memories (ROMs).

* * * * *